United States Patent
Yatsuo et al.

(10) Patent No.: US 7,728,336 B2
(45) Date of Patent: Jun. 1, 2010

(54) SILICON CARBIDE SEMICONDUCTOR DEVICE AND METHOD FOR PRODUCING THE SAME

(75) Inventors: Tsutomu Yatsuo, Ibaraki (JP); Shinsuke Harada, Ibaraki (JP); Mitsuo Okamoto, Ibaraki (JP); Kenji Fukuda, Ibaraki (JP); Makoto Kato, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/310,992

(22) PCT Filed: Sep. 13, 2007

(86) PCT No.: PCT/JP2007/067838

§ 371 (c)(1),
(2), (4) Date: Jul. 1, 2009

(87) PCT Pub. No.: WO2008/047522

PCT Pub. Date: Apr. 24, 2008

(65) Prior Publication Data

US 2010/0012951 A1   Jan. 21, 2010

(30) Foreign Application Priority Data

Oct. 16, 2006 (JP) .............................. 2006-280836

(51) Int. Cl.
*H01L 31/0312* (2006.01)

(52) U.S. Cl. .......... 257/77; 257/E21.054; 257/E29.104; 438/268

(58) Field of Classification Search ................. 257/77, 257/E29.104, E21.054; 438/268
See application file for complete search history.

(56) References Cited

U.S. PATENT DOCUMENTS

| | | | |
|---|---|---|---|
| 6,054,352 A | 4/2000 | Ueno | |
| 7,365,363 B2 * | 4/2008 | Kojima et al. | 257/77 |
| 7,528,040 B2 * | 5/2009 | Das et al. | 438/268 |
| 2005/0230686 A1 | 10/2005 | Kojima et al. | |
| 2006/0057796 A1 * | 3/2006 | Harada et al. | 438/199 |
| 2008/0090383 A1 * | 4/2008 | Nakamura et al. | 438/465 |
| 2009/0134402 A1 * | 5/2009 | Yatsuo et al. | 257/77 |
| 2009/0173949 A1 * | 7/2009 | Yatsuo et al. | 257/77 |

FOREIGN PATENT DOCUMENTS

| | | |
|---|---|---|
| JP | 10-233503 | 9/1998 |
| JP | 2005-252157 | 9/2005 |
| JP | 2005-310886 | 11/2005 |
| JP | 2006-147789 | 6/2006 |
| WO | 2004/036655 | 4/2004 |

* cited by examiner

OTHER PUBLICATIONS

International Search Report mailed Dec. 4, 2007 for International Application No. PCT/JP2007/067838.

*Primary Examiner*—Trung Dang
(74) *Attorney, Agent, or Firm*—Wenderoth, Lind & Ponack, L.L.P.

(57) ABSTRACT

In an SiC vertical MOSFET comprising a channel region and an n-type inverted electron guide path formed through ion implantation in a low-concentration p-type deposition film, the width of the channel region may be partly narrowed owing to implantation mask positioning failure, and the withstand voltage of the device may lower, and therefore, the device could hardly satisfy both low on-resistance and high withstand voltage. In the invention, second inverted layers (41, 42) are provided at the same distance on the right and left sides from the inverted layer (40) to be the electron guide path in the device, and the inverted layers are formed through simultaneous ion implantation using the same mask, and accordingly, the length of all the channel regions in the device is made uniform, thereby solving the problem.

17 Claims, 7 Drawing Sheets

SILICON CARBIDE SEMICONDUCTOR DEVICE AND METHOD FOR PRODUCING THE SAME

TECHNICAL FIELD

The present invention relates to the configuration of a vertical MOSFET having a low on-resistance and a high voltage and using silicon carbide as the constitutive material, and to a method for producing the same.

BACKGROUND ART

The single crystal of silicon carbide (SiC) has excellent physical properties, such as a wide band gap, a high dielectric breakdown intensity and a large saturation drift velocity of electrons, as compared with the single crystal of silicon (Si). Therefore, use of SiC as the constitutive material makes it possible to fabricate a semiconductor device for use with an electrical power of high withstand voltage and low resistance exceeding Si. In addition, like Si, SiC is characterized in that it may form an insulating layer through thermal oxidation. These facts lead to a supposition that the fabrication of a vertical MOSFET having a high withstand voltage and a low on-resistance and using the single crystal of SiC as the constitutive material is feasible. Numerous researches and developments directed to this fabrication have been under path.

When SiC is used as the constitutive material, a vertical MOSFET (D-MOSFET) could not be fabricated by the double diffusion method that is generally applied to Si. This is because the diffusion coefficient of impurity dopants is extremely small in the crystal of SiC and the formation of channel regions is consequently precluded by the difference in the transverse diffusion length between the p-type and n-type impurity dopants. Thus, the vertical MOSFET similar to D-MOSFET of Si is fabricated through ion implantation of p-type and n-type impurities (double ion implantation method). This method, however, degrades the electron mobility because numerous crystal defects induced by ion implantation remain in the channel region and scatter the conductive electrons induced in the channel. The SiC vertical MOSFET fabricated according to the double ion implantation method has a channel mobility of from 5 to 10 $cm^2/Vs$, an extremely small value as compared with the channel mobility of about 500 $cm^2/Vs$ that the Si D-MOSFET has. As a result, the device entails a problem in that its on-resistance is far higher than the theoretical value thereof.

As a means to solve this problem, a configuration that forms the channel region not by ion implantation but with a deposition film has been proposed. A typical examples of this configuration is disclosed in Patent Reference 1 that was filed on Oct. 3, 2003. FIG. 7 is a cross-sectional view of the unit cell of the configuration. In this configuration, a low-concentration n-type drift layer 2 is deposited on a high-concentration n-type substrate 1, a high-concentration p-type gate layer 31 is formed by ion implantation on the surface of the n-type drift layer 2, and a low-concentration p-type layer 32 is deposited further thereon. On the surface part of the low-concentration p-type layer 32, an n-type source layers 51 and 52 are selectively formed by ion implantation, a gate electrode 7 is formed via a gate oxide film 6, and further a source electrode 9 is formed via an interlayer insulation film 8. Channel regions 11 and 12 are formed in the low-concentration p-type deposition layer 32 directly below the gate oxide film 6. The configuration is characterized in that an electron guide path 40 penetrating through the low-concentration p-type deposition layer 32 and reaching the n-type drift layer 2 is selectively formed through ion implantation of an n-type impurity from the surface (hereinafter the electron guide path 40 will be occasionally referred to as "inverted layer 40"). Since this configuration has the channel regions 11 and 12 formed in the low-concentration p-type deposition layer that has undergone no ion implantation, it is capable of acquiring a high mobility of conductive electrons and permitting fabrication of a vertical MOSFET having a small on-resistance. It is further characterized in that the leak of an electric field into the gate oxide film near the channel regions 11 and 12 can be prevented and the source/drain withstand voltage can be heightened because the depletion layer transversely extending from the high-concentration p-type gate layer 31 to the low-concentration n-type drift layer 2 in the state of voltage block enables the vertical channel part 24 to be completely pinched off at a low voltage.

However, this configuration entails a problem that makes it difficult to satisfy both high withstand voltage and low on-resistance, as described below. This is based on the difference between the length a and the length b of the channel regions 11 and 12 formed on the right and left sides of the inverted layer 40. Before the reason is described in detail, first described hereinunder is the reason why there occurs the difference between the length a and the length b in the conventional configuration and according to its production method.

FIG. 8(*a*) to (*e*) show a part of a process for producing the SiC-MOSFET having a conventional configuration shown in FIG. 7. These are cross-sectional views of the unit cell of the configuration. First, a low-concentration n-type drift layer 2 doped with $5 \times 10^{15}$ $cm^{-3}$ of nitrogen is deposited on a high-concentration n-type substrate 1 to a thickness of 15 μm (a). Next, a high-concentration p-type layer 31 is formed through p-type impurity ion implantation 3*a* via a mask 130 (b). The mask 130 is formed by patterning through photolithography of an $SiO_2$ film deposited on the surface according to a reduced-pressure CVD method. After the mask is removed, a low-concentration p-type layer 32 doped with $5 \times 10^{15}$ $cm^{-3}$ of aluminum is deposited on the surface to a thickness of about 0.5 μm (c). Next, an n-type inverted layer 40 is formed through n-type impurity ion implantation 4*a* via a mask 140, and the implanted region is converted (reversed) from p-type to n-type (d). For the n-type impurity ion implantation 4*a*, nitrogen ions are implanted at room temperature at an acceleration energy of from 40 keV to 250 keV to a dose of $1 \times 10^{16}$ $cm^{-3}$. After the mask 140 is removed, n-type source layers 51 and 52 are formed through n-type impurity ion implantation 5*a* via a mask 150 (e). For the n-type impurity ion implantation 5*a*, phosphorus ions are implanted at a substrate temperature of 500° C. at an acceleration energy of from 40 keV to 250 keV to a dose of $2 \times 10^{20}$ $cm^{-3}$. Next, this is annealed for activation in an argon atmosphere at 1500° C. for 30 minutes, and a gate insulation film 6, a gate electrode 7, a source electrode 9 and a drain electrode 10 are formed to complete the device.

In the production process, the inverted layer 40 and the n-type source layers 51 and 52 are formed according to an ion implantation method using different implantation masks 140 and 150. Accordingly, the distance to the position at which the n-type source layers 51 and 52 are formed, relative to the position at which the inverted layer 40 is formed, is not always the same. Specifically, this depends on the positioning accuracy in photolithography in mask-patterning the layers, and even under the most careful positioning operation, there may occur a position shift within a positioning accuracy of the alignment device itself of generally about 0.5 μm. As a result, there may be a dimensional difference of 2 times the position shift between the length a and the length b of the channel regions 11 and 12 to be defined as a relative position to the right and left edges of the inverted layer 40 and the right side edge of the n-type source layer 51 and the left side edge of 52. In general, the length of the channel regions 11 and 12 (the value of a, b) is planned to be from 1.0 to 1.5 µm or so, and in case where the length is taken as 1.0 µm and the position shift of the two masks is the same, 0.5 µm, as that of the positioning accuracy of the alignment device, then the length a is 1.5 µm but the length b is 0.5 µm, of that is, there occurs a difference of 1.0 µm between the lengths a and b.

The above description relates to the difference between the length of the right-side channel region and that of the left-side channel region in one unit cell; but in a practical device, a large number of cells, or that is, more than tens of thousands of cells are aligned in parallel in a semiconductor chip having a few mm square, and between the cells in the chip, there may occur a difference in the length between the channel regions. Accordingly, in one device, the ununiformity of the length of the channel regions further expands.

The conventional configuration in which the length of the channel region differs not only in a unit cell but also between unit cells constituting a device in the manner as above has an extremely serious problem in that it could not satisfy the requirement of low on-resistance and high withstand voltage of MOSFET. This is described below. Specifically, this configuration is characterized in that the leak of an electric field into the gate oxide film near the channel regions 11 and 12 can be prevented and the source/drain withstand voltage can be heightened because the depletion layer transversely extending from the high-concentration p-type gate layer 31 to the low-concentration n-type drift layer 2 in the state of voltage block enables the vertical channel part 24 to be completely pinched off at a low voltage. In this state, the voltage of from 30 to 50 V before the complete pinching off of the vertical channel part 24 must be blocked in the horizontal MOSFET part that comprises the n-type inverted layer 40, the p-type channel regions 11 and 12, the n⁺ source layers 51 and 52, the gate oxide film 6 and the gate 7. When the horizontal MOSFET part could not block the voltage of from 30 to 50 V, then source/drain withstand of the vertical MOSFET of this configuration is greatly degraded. The voltage block characteristic of this part is defined by the punch-through voltage in the npn transistor part composed of n-type inverted layer/p-type channel region/n⁺ source layer. In other words, this greatly depends on the impurity concentration and the length (value a, b) of the p-type channel regions 11 and 12, and for keeping a punch-through voltage of from 30 to 50 V or more, these must be larger than predetermined values. However, for reducing the on-resistance of the vertical MOSFET, the channel mobility thereof must be increased, and therefore, the p-type impurity concentration in the channel regions 11 and 12 are reduced as much as possible and at the same time the length of the channel regions is shortened as much as possible to thereby reduce the channel resistance as much as possible. Accordingly, the degree of freedom in planning the impurity concentration and the length (that is, the length a and the length b) of the channel regions 11 and 12 is small, and in general, the p-type impurity concentration is planned to be from $5 \times 10^{15}$ to $1 \times 10^{16}$ cm$^{-3}$ and the length is to be from 1.0 to 1.5 µm or so, as so mentioned in the above. In the thus-planned MOSFET, when any of the length a or b is made smaller than the defined value owing to the limitation to the positioning accuracy in the production process as described in [0007], then the withstand voltage of the vertical MOSFET greatly lowers.

FIG. 9 shows experimental examples of the relation between the channel length $L_G$ and the drain/source withstand voltage $V_{BD}$ of a vertical MOSFET having a conventional configuration. The data of three test lots (black circle, black square, black triangle) are shown. In this, the channel length $L_G$ is not a found value, but is a planned length in a virtual case where the mask positioning accuracy is estimated as ±0 µm. When the channel length is 1.5 µm, all the three cases have a withstand voltage of 800 V; but when the channel length is 1.2 µm, then the withstand voltage is from 600 V to 700 V, and further when the channel length is 1.0 µm, then the withstand voltage is from tens V to 400 V. Thus, the withstand voltage fluctuates greatly. The reason for the extreme reduction and fluctuation in the withstand voltage may be considered because, as so mentioned in the above, the channel length $L_G$ fluctuated within a range of from 0.5 µm to 1.5 µm owing to the mask positioning failure in the actual device, and at the site having a smallest $L_G$, the device showed a low withstand voltage.

As in these experimental examples, when the channel length is designed to be at least 1.5 µm, then devices having a predetermined withstand voltage can be produced at a high yield, but on the other hand, the devices shall have a large on-resistance in proportion to the channel length thereof. In addition, for devices having a further higher withstand voltage, the channel length must be set further longer, therefore bringing about a problem in that the on-resistance of the devices increases further. Specifically, vertical MOSFET devices having a conventional configuration and produced according to a conventional method could hardly satisfy both the requirement of low on-resistance and the requirement of high withstand voltage.

To solve the problem that, owing to the limitation to the positioning accuracy in the production process, a part having a short channel length may form as in the above and the withstand voltage is thereby lowered, a modification may be taken into consideration for the conventional production process shown in FIG. 8. Concretely, in the step (d) to form the inverted layer 40 through nitrogen ion implantation, the implantation mask 140 is holed to have an opening at nearly the same position as the position at which the source layers 51 and 52 are formed, and also in the opening, nitrogen ion are implanted to thereby form the inverted layer 40 and the source layers 51 and 52 all at the same time. In this case, however, there is a problem in that, since the nitrogen dope concentration in the source layer part could not fully increase, the resistance inside the source layer and the contact resistance of the source contact increase. When high-concentration phosphorus ions are implanted in the step (e), using the same mask, then the problem of the source layer concentration could be solved, but the impurity concentration in the inverted layer part increases too much, therefore often causing a problem of dielectric breakdown since a strong electric field is applied to the gate oxide film 6 existing between the gate electrode 7 and the inverted layer before the vertical channel part is completely pinched off. In addition, after the vertical channel part has been pinched off, the electric field may be further strengthened owing to the voltage increase, and owing to the dielectric breakdown of the gate oxide film in this part, there occurs still another problem in that the source/drain withstand voltage shall be limited to be low. Anyhow, the conventional configuration and the conventional production method have extremely serious problems in that MOSFET could hardly satisfy both the requirement of low on-resistance and the requirement of high withstand voltage. Patent Reference 1: WO04/036655

DISCLOSURE OF THE INVENTION

Problems that the Invention is to Solve

In the conventional configuration in which a channel region is formed of a low-concentration p-type deposition film and its conductivity is reversed from p-type to n-type through ion implantation to form an electron guide path, the channel mobility may increase and therefore, the on-resistance of the configuration may be reduced. However, in the conventional configuration and its production method, the reversed-implanted layer and the source layer are formed in an ion implantation method using different masks, and therefore, there occurs a problem in that the length of the channel region fluctuates variously not only in the unit cell but also between the cells constituting a device, owing to the position shift of the two masks, and therefore the withstand voltage of the vertical MOSFET lowers. When the channel length is shortened for reducing the on-resistance, this problem is more remarkable. Specifically, an SiC vertical MOSFET having a conventional configuration produced according to a conventional production method, where the channel region is formed of a low-concentration p-type deposition film and its conductivity is reversed from p-type to n-type through ion implantation, has a serious problem owing to the limitation to the positioning accuracy in the method, in that the device could hardly satisfy both the requirement of having a further lower on-resistance and the requirement of having a further higher withstand voltage.

In consideration of these problems, an object of the invention is to realize an SiC vertical MOSFET having a low on-resistance and a high withstand voltage, and to provide a novel configuration of an SiC vertical MOSFET having a channel region formed of a low-concentration p-type deposition film.

Another object of the invention is to provide a simplified production method for a low on-resistance and high withstand-voltage, SiC vertical MOSFET having a channel region formed of a low-concentration p-type deposition layer.

Still another object of the invention is to provide a configuration and a production method capable of producing, at a high yield, a low on-resistance and high withstand-voltage, SiC vertical MOSFET having a channel region formed of a low-concentration p-type deposition layer.

Means for Solving the Problems

To solve the above-mentioned problems, the invention is an SiC vertical MOSFET wherein the channel region is formed of a low-concentration p-type deposition film and its conductivity is inverted from p-type to n-type through ion implantation to form an electron guide path (inverted layer 40) and wherein second inverted layers (41, 42) are provided each at the position spaced from the inverted layer (40) by nearly the same length on the right and left sides thereof, and right and left source layers (51, 52) are so formed that their inner edges could be positioned inside the second inverted layers (41, 42), respectively.

In the above configuration, second inverted layers (41, 42) are formed through ion implantation with the same doping distribution using the same mask as in the inverted layer (40).

The source layers (51, 52) are formed in the surface part at the same position as that of the second inverted layers (41, 42).

The source layers (51, 52) are formed through ion implantation using the same mask as in the second inverted layers (41, 42).

Effect of the Invention

In the invention, the channel length on the right and left sides in the unit cell and all the channel length inside a semiconductor device may be nearly a uniform length, and therefore, the device of the invention is free from a trouble of withstand voltage depression to be caused by partial shortening of the channel length therein. In addition, since the channel length fluctuation therein can be retarded, the device is free from a trouble of withstand voltage depression even though the length is set to be at most 1.0 µm or less. Accordingly, an SiC vertical MOSFET has been realized capable of satisfying both the requirement of low on-resistance and the requirement of high withstand voltage.

In addition, the channel length in the device can be made nearly the same not requiring any precision positioning accuracy, and therefore, an SiC vertical MOSFET having a low on-resistance and a high withstand voltage can be produced according to a simplified process at a high yield.

DESCRIPTION OF REFERENCE NUMERALS

Figure 1:
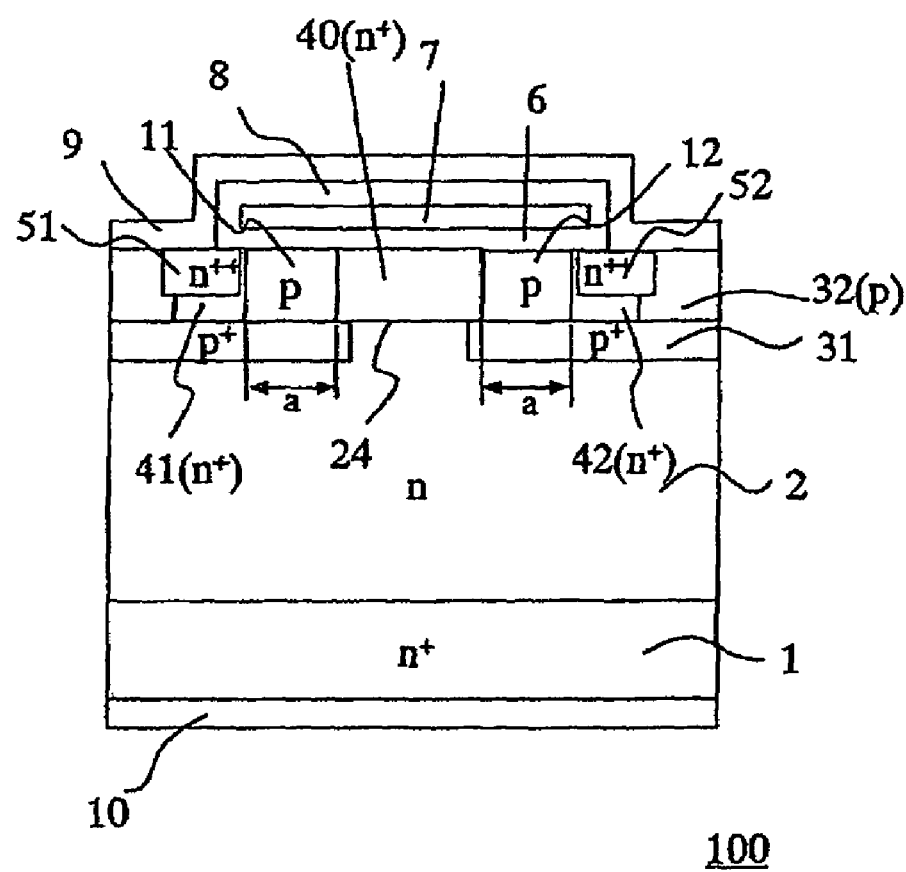
FIG. 1 is a cross-sectional view of a unit cell of an SiC vertical MOSFET of the first embodiment of the invention.

1. High-concentration n-type substrate
2. Low-concentration n-type drift layer
3. High-concentration p-type well layer
3*a*. p-Type impurity ion implantation
4*a*. n-Type impurity ion implantation
5*a*. n-Type impurity ion implantation
6. Gate insulation film
7. Gate electrode
8. Interlayer insulation film
9. Source electrode
10. Drain electrode
11, 12. Channel region
24. Partial deficiency part of p-type layer
31. High-concentration p-type layer
32. Low-concentration p-type deposition film
33. Low-concentration n-type deposition film
40, 41, 42. n-type inverted layer
51, 52. High-concentration n-type source layer
00, 100, 200, 300. Cross section of unit cell
130, 140, 150, 160. Ion implantation mask
141, 142. Opening of mask 140
151, 152. Opening of mask 150

BEST MODE FOR CARRYING OUT THE INVENTION

The invention is described in detail with reference to specific embodiments thereof.

Embodiment 1

FIG. 1 is a cross-sectional view of a unit cell of an SiC vertical MOSFET of the first embodiment of the invention. In this configuration, an n-type drift layer 2 having a doping concentration of about $5 \times 10^{15}$ cm$^{-3}$ and a thickness of 15 µm is deposited, on an n-type SiC substrate 1 doped with nitrogen at a high concentration. On the surface of the layer to the depth thereof of 0.5 µm, an aluminum-doped p-type layer 31 is formed; and a partial deficiency part 24 having a length of from 1.0 to 2.0 µm is formed in the p-type layer 31. A p-type layer 32 having a thickness of about 0.5 µm is deposited on the surface of the p-type layer 31 and on the surface of the n-type drift layer 2 in the partial deficiency part 24. Near the part projected in the thickness direction of the partial deficiency part 24 of the p-type layer 32, formed is a first inverted layer 40, which is reversed from p-type to n-type through doping with nitrogen thereinto and which is formed to run through the p-type layer 32 to reach the depth of the n-type layer 2. At the position spaced from both edges of the first reversed-implanted layer 40 by the length a, second reversed-implanted layers 41 and 42 are formed, which are reversed from p-type to n-type like the first reversed-implanted layer 40. Channel regions 11 and 12 are formed in the surface layer of the p-type layer 32 in the part sandwiched between the first inverted layer 40 and the second inverted layers 41 and 42; and the length of the channel regions is the same. High-concentration phosphorus-doped n-type source layers 51 and 52 are formed so that at least one edge of each layer could be positioned inside the second inverted layer. A gate electrode 7 of a polycrystalline silicon film is formed on the surface of the above-mentioned first inverted layer 40, the channel regions 11 and 12, the second inverted layers 41 and 42, and the n-type source layers 51 and 52, via a gate insulation film 6; and a source electrode 9 is formed on the gate electrode 7 via an interlayer insulation film 8, as connected to the surface of the n-type source layers 51 and 52 and to the surface of the p-type layer 32 in a mode of low-resistance interconnection. To the back of the high-concentration n-type substrate 1, a drain electrode 10 is connected in a mode of low-resistance interconnection.

The driving mode of the SiC vertical MOSFET is basically the same as that of a conventional vertical MOSFET. Specifically, in the ON state, when a gate voltage over the threshold electrode is applied to the gate electrode 7, then an n-type reverse channel is induced on the surface of the channel regions 11 and 12 of the p-type layer 32. Accordingly, the n-type source layers 51 and 52 and the n-type drift layer 2 are connected to each other via the electron guide path that passes through the second inverted layers 41 and 42, the channel regions 11 and 12, the first inverted layer 40 and the partial deficiency part 24, whereby a current runs from the drain electrode 10 to the source electrode 9. The reverse channel is induced in the surface layer of the channel regions 11 and 12 formed in the deposition layer having a high crystal quality and having a relatively low impurity concentration, thereby bringing about a high channel mobility of tens cm$^2$/Vs, and a vertical MOSFET having a low on-resistance can be thereby obtained.

In the OFF-state, the voltage applied between the source/drain electrodes is blocked by the pn junction formed between the high-concentration p-type layer 31 and the n-type drift layer 2; however, until the partial deficiency part 24 of the p-type layer 31 is completely pinched off by the depletion layer extending from the pn junction on both sides, the voltage is blocked by the MOSFET part in the lateral direction comprising the first inverted layer 40, the channel region 11 (12), the second inverted layer 41 (42), the n-type source layer 51 (52), the gate oxide film 6 and the gate electrode 7. The length of the partial deficiency part 24 of the p-type layer 31 is from 1 to 2 µm, and the doping concentration in the n-type drift layer 2 is about $5 \times 10^{15}$ cm$^{-3}$, and therefore the pinch-off voltage is from 30 to 50 V. When the MOSFET part in the lateral direction could withstand the voltage, then the source/drain withstand voltage could be 1000 V or more. In this case, the MOSFET parts in the lateral direction on the right and the left, or that is, the two MOSFET parts in the lateral direction, the MOSFET part in the lateral direction on the left that comprises the first inverted layer 40, the channel region 11, the second inverted layer 41 and the n-type source layer 51, and the MOSFET part in the lateral direction on the right that comprises the first inverted layer 40, the channel region 12, the second inverted layer 42 and the n-type source layer 52, are disposed in parallel to each other; and in this configuration, the channel region 11 and the channel region 12 in the MOSFET part in the lateral direction are so designed as to have the same length, and therefore, the blocking property of the two is nearly the same, or that is, the blocking voltage of one region is not extremely lower than that of the other region, and the two regions can have a high blocking voltage of more than the pinch-off voltage of from 30 to 50 V. As a result, even in a case where the channel length is set short, for example, 1.0 µm or less, drain/source withstand voltage may be a high voltage of 1000 V or more.

FIG. 2(a) to (e) and FIG. 3(f) to (j) show a production process for the SiC vertical MOSFET of the first embodiment of the invention. These are cross-sectional views of the unit cell. First, a low-concentration n-type drift layer 2 doped with $5 \times 10^{15}$ cm$^{-3}$ of nitrogen is deposited on a high-concentration n-type substrate 1 doped with $5 \times 10^{18}$ cm$^{-3}$ of nitrogen and having a thickness of about 300 µm, to a thickness of 15 µm thereon (a). Next, a high-concentration p-type layer 31 is formed through p-type impurity ion implantation 3a via a mask 130 (b). The mask 130 is formed by patterning through photolithography of an SiO$_2$ film having a thickness of 1 µm deposited on the surface according to a reduced-pressure CVD method. For the p-type impurity ion implantation 3a, aluminum ions of a dose of $2 \times 10^{16}$ cm$^{-3}$ are implanted at a substrate temperature of 500° C. and at an acceleration energy of from 40 keV to 250 keV. After the mask is removed, a low-concentration p-type layer 32 doped with $5 \times 10^{15}$ cm$^{-3}$ of aluminum is deposited on the surface to a thickness of about 0.5 µm (c). Next, an SiO$_2$ film mask 140 having a thickness of about 1 µm deposited on the surface of the low-concentration p-type layer 32 again also according to a reduced-pressure CVD method is patterned through photolithography. The mask 140 has a first opening 141 formed at the position projected in the thickness direction of the partial deficiency part 24 of the high-concentration p-type layer 31 and a second opening 142 having a length of about 1.5 formed at the right-hand and left-hand positions spaced from both edges of the opening 141 by the length a of about 1.0 µm. Via the mask 140, the n-type impurity ion implantation 4a is attained (d). Through the n-type impurity ion implantation 4a with nitrogen ions to a dose of $1 \times 10^{16}$ cm$^{-3}$ at room temperature and at an acceleration energy of from 40 keV to 250 keV, formed are a first inverted layer 40 and second inverted layers 41 and 42, as reversed from p-type to n-type, at the position of the first opening 141 and the second opening 142 of the mask. After the mask 140 is removed, n-type source layers 51 and 52 are formed through n-type impurity ion implantation 5a via a mask 150 (e). The mask 150 has openings 151 and 152 formed through lithography near the surface of the second inverted layers 41 and 42. The openings 151 and 152 each have a length of about 1.5 μm, as formed so that one edge thereof could be positioned on the surface of the second inverted layers 41 and 42. For the n-type impurity ion implantation 5a, phosphorus ions are implanted at a substrate temperature of 500° C. at an acceleration energy of from 40 keV to 250 keV to a dose of $2 \times 10^{20}$ cm$^{-3}$. After the mask 150 is removed, this is annealed for activation in an argon atmosphere at 1500° C. for 30 minutes. Accordingly, all the implanted ions in the already ion-implanted high-concentration p-type layer 31, the first reversed-implanted layer 40 and the second reversed-implanted layers 41 and 42, and the n-type source layers 51 and 52 are activated to form the respective conductive regions. Next, a gate insulation film 6 having a thickness of 40 nm is formed through thermal oxidation at 1200° C. for 140 minutes (f); and 0.3 μm-thick polycrystalline silicon deposited thereon according to a reduced-pressure CVD method is patterned through photolithography to form a gate electrode 7 (g). Further, the CVD deposition film except the part coated with the polycrystalline silicon film is removed (h). Next, a 0.5 μm-thick interlayer insulation film 8 is deposited on the surface according to a reduced-pressure CVD method. A window is formed through the interlayer insulation film 8 (i), and a source electrode 9 common to the surface of the n-type source layers 51 and 52 and the p-type layer 32 is formed and this is connected to the drain electrode 10 formed on the surface of the n-type SiC substrate 1, in a mode of low-resistance interconnection.

Figure 8:
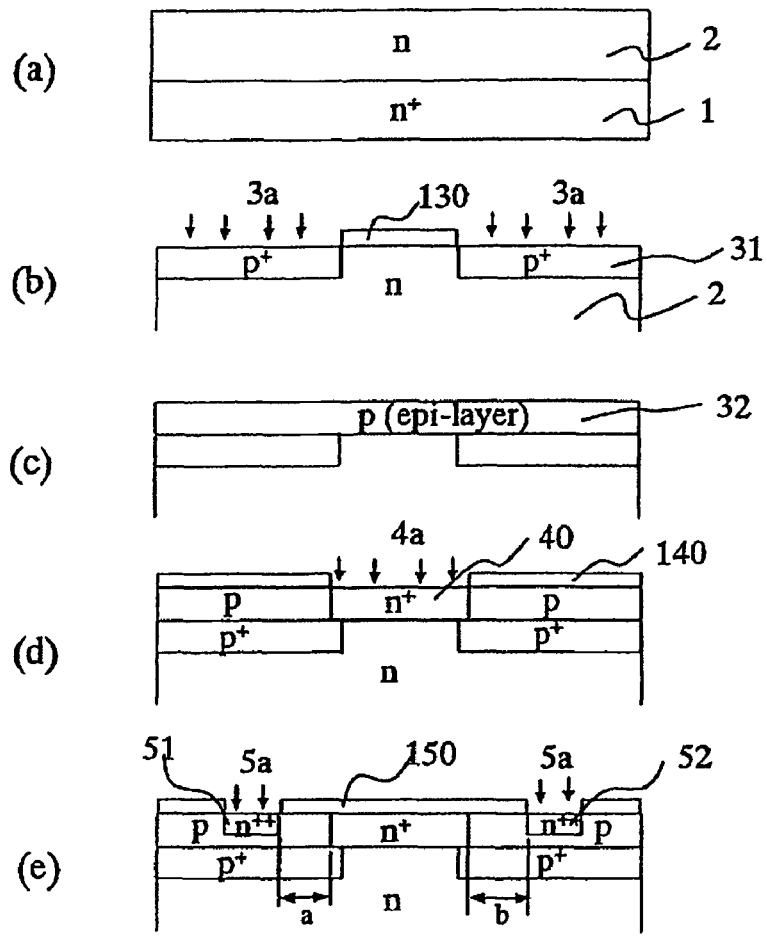
FIG. 8(*a*) to (*e*) are cross-sectional views of a cell in a process of producing a conventional SiC vertical MOSFET.
Figure 9:
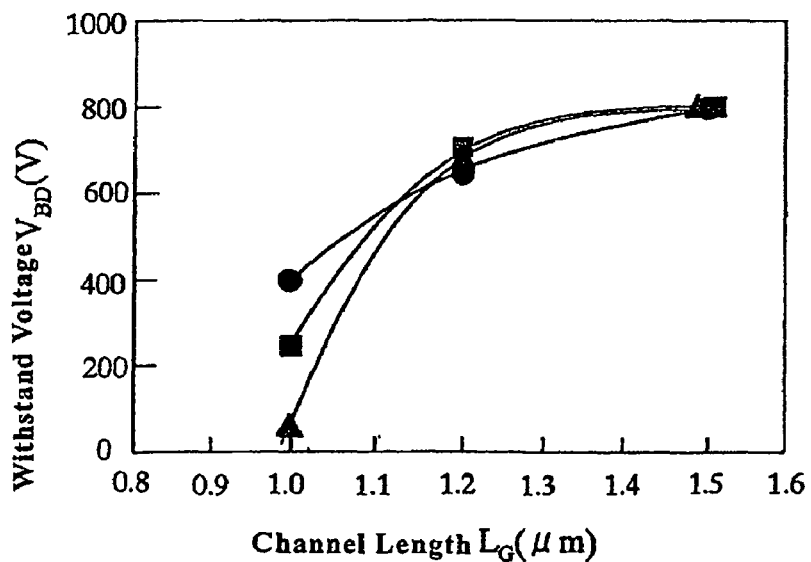
FIG. 9 is a graph showing the relation between the planned channel length and the withstand voltage of a conventional SiC vertical MOSFET.

As described in the above, in the production method of the first embodiment of the invention, the first inverted layer 40 and the second inverted layers 41 and 42 are formed at the same time through the nitrogen ion implantation (4a) using the same mask 140. Accordingly, the length of the right and left channel regions, or that is, the length a of the channel region 11 and the channel region 12 does not differ from each other, not depending on the masking accuracy as in the conventional production method shown in FIG. 8, but can be formed just as the planned length a. As a result, the withstand voltage of the MOSFET of this configuration can be kept high on the right and left sides in the lateral direction thereof, and even though the length a is set as 1.0 μm or shorter than it, the source/drain withstand voltage in this configuration could be a high voltage of 1000 V or more, as so mentioned in the paragraph [0024].

Embodiment 2

Figure 4:
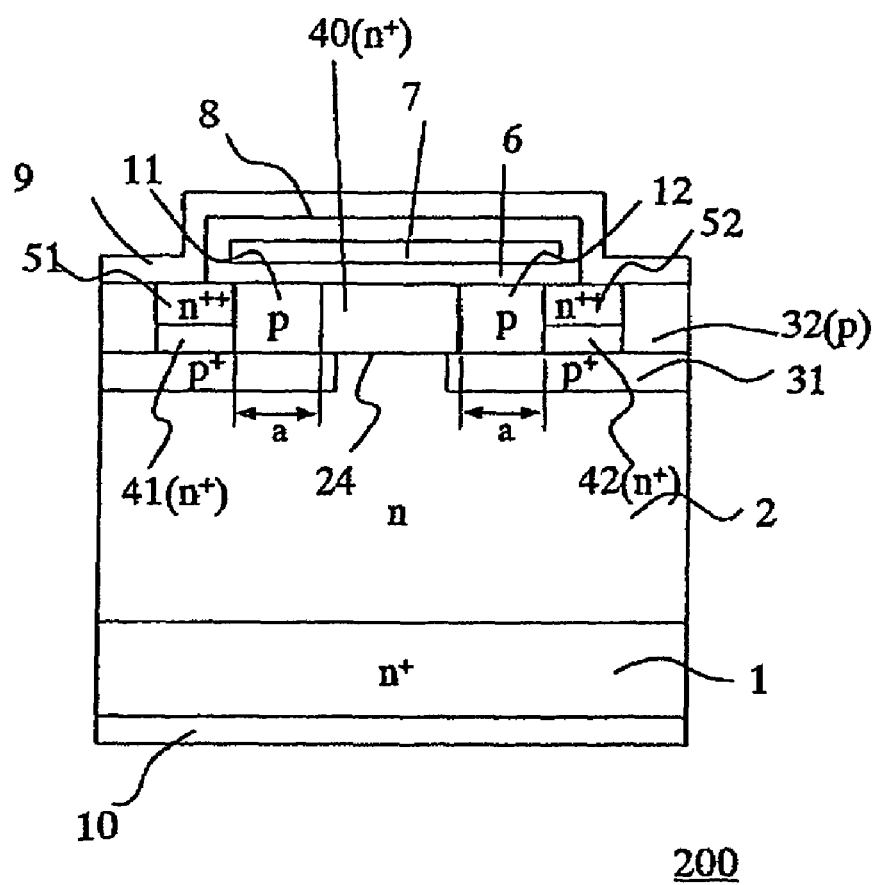
FIG. 4 is a cross-sectional view of a unit cell of an SiC vertical MOSFET of the second embodiment of the invention.

FIG. 4 is a cross-sectional view of a unit cell of an SiC vertical MOSFET of the second embodiment of the invention. Of the reference numerals indicating the constitutive members in the drawing, the same numerals as those in the above-mentioned FIG. 1 indicate the same members. The basic configuration of the cell is the same as in the Embodiment 1 in FIG. 1. The difference from the Embodiment 1 is only the relative positioning of the second inverted layers 41 and 42 and the n-type source layers 51 and 52. Concretely, in the Embodiment 1, the n-type source layers 51 and 52 are so formed that at least one edge thereof is to be positioned inside the second inverted layer, but the position of the other edge of the n-type source layer is not specifically defined. As opposed to this, in the Embodiment 2, the n-type source layers 51 and 52 are nearly in the same position as that of the second inverted layers 41 and 42, and are so provided that all are to be positioned in the surface part of the inverted layer; and this is the difference.

In the Embodiment 2, the length a of the right and left channel regions 11 and 12 is the same, like in the Embodiment 1, therefore securing the good voltage blocking characteristic. In this embodiment, in addition, the distance between the first inverted layer 40 and the right and left n-type source layers 51 and 52 is nearly the same, and therefore in the ON state, the resistance of the right and left current guide paths near the channel regions could be nearly the same, therefore enabling further reduction in the on-resistance and enhancement of the resistance in overcharging owing to the unification of the on-current.

Figure 2:
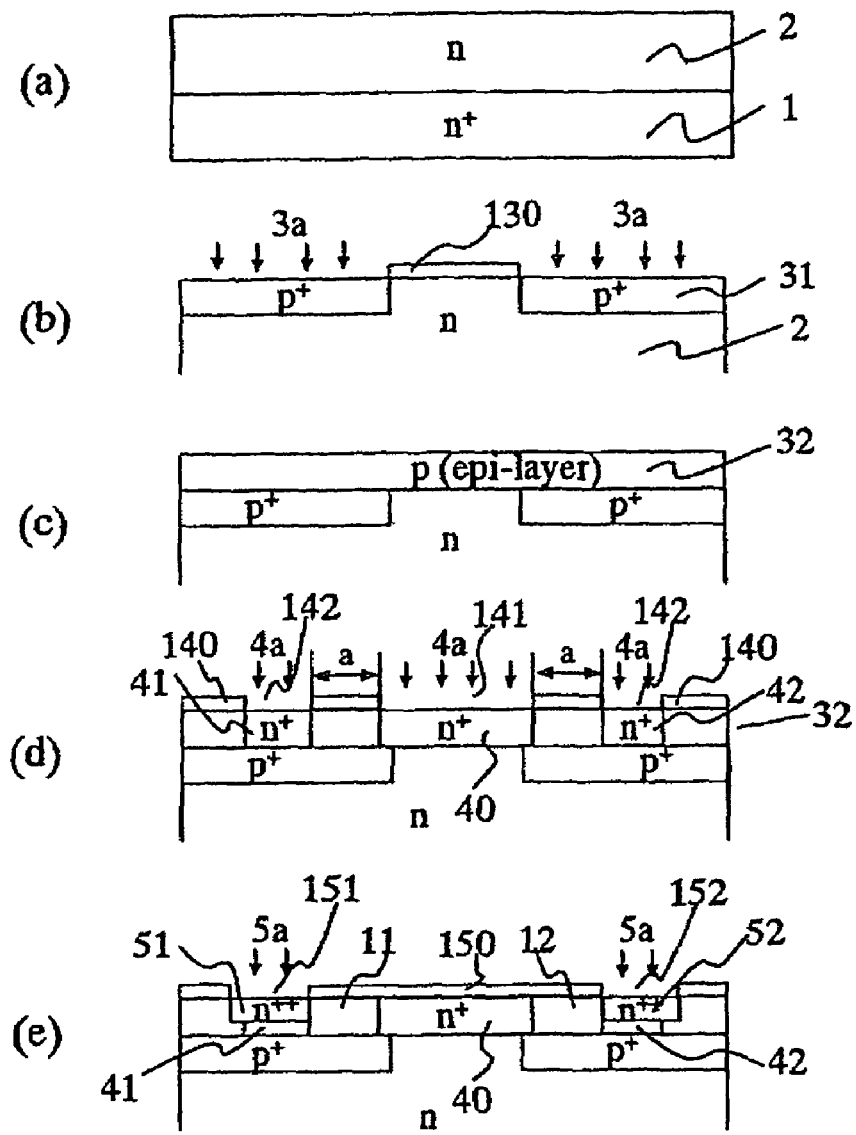
FIG. 2(*a*) to (*e*) are cross-sectional views of a cell in a process of producing an SiC vertical MOSFET of the first embodiment of the invention.
Figure 3:
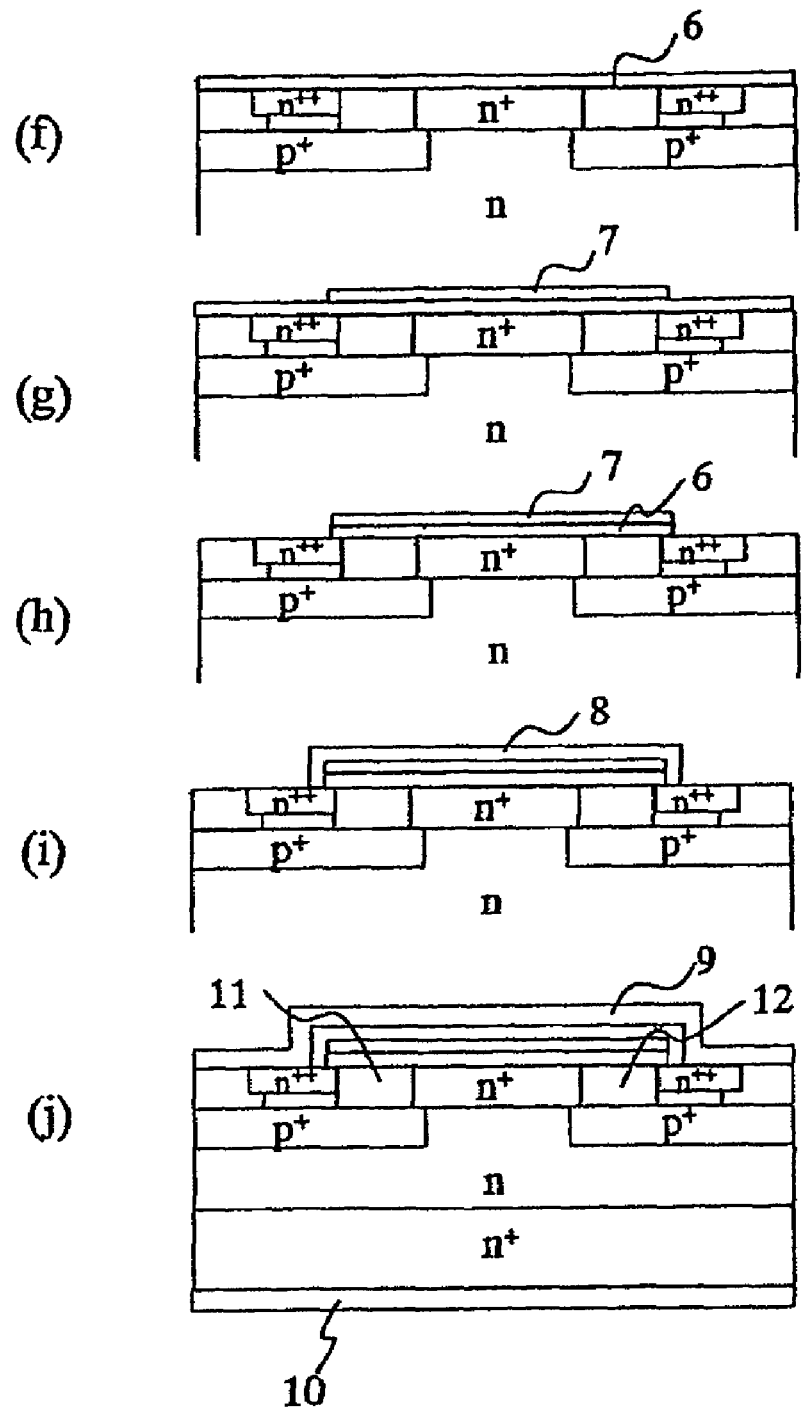
FIG. 3(*f*) to (*j*) are cross-sectional views of a cell in a process of producing an SiC vertical MOSFET of the first embodiment of the invention.

FIG. 5(a) to (f) show a part of a production process for the SiC vertical MOSFET of the second embodiment of the invention. These are cross-sectional views of the unit cell. Of the reference numerals indicating the constitutive members in the drawing, the same numerals as those in FIG. 2 showing a production process of the Embodiment 1 indicate the same members. The process to the step (d) of forming the inverted layers 41 and 42 from the starting substrate (a) through nitrogen ion implantation (4a) is the same as that in the Embodiment 1 shown in FIG. 2. The difference is the step (e) of forming the n-type source layers 51 and 52. Specifically, for implanting the n-type source layers 51 and 52 through phosphorus ion implantation (5a), the same mask as that of the implantation mask 140 used in forming the inverted layers 40, 41 and 42 is used in the production method of the Embodiment 2, though in the production method of the Embodiment 1, the mask 150 that differs from the implantation mask used in forming the inverted layers 40, 41 and 42 is used; and in the Embodiment 2, the opening 141 of the mask 140 is covered with an additional mask 160 to thereby attain high-concentration phosphorus ion implantation (5a) only into the part of the opening 142.

Figure 5:
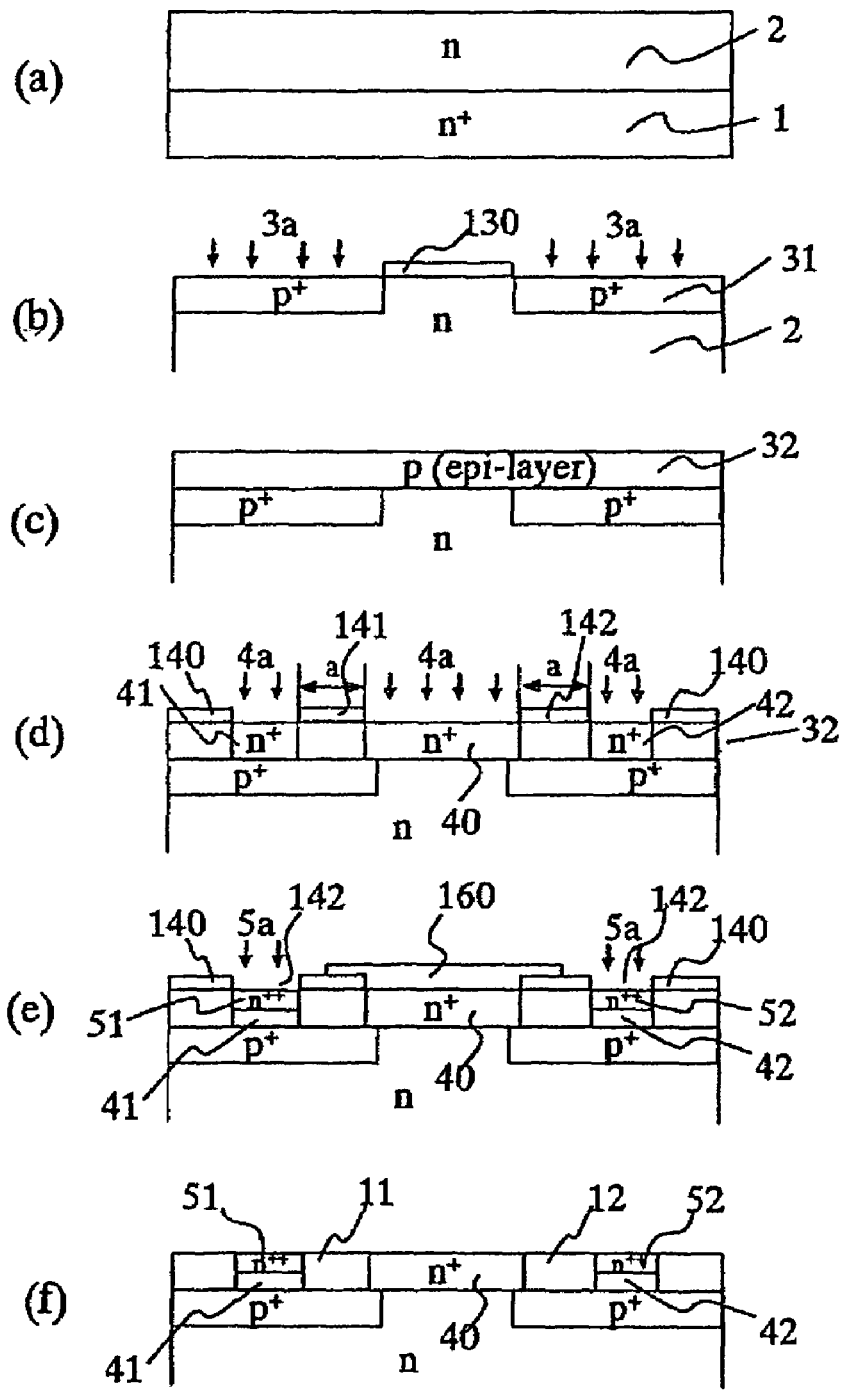
FIG. 5(*a*) to (*f*) are cross-sectional views of a part of a process of producing an SiC vertical MOSFET of the second embodiment of the invention.

According to the production method of FIG. 5, high-concentration n-type source layers 51 and 52 are formed in the same position as that of the second inverted layers 41 and 42, not increasing the concentration of the n-type impurity in the surface part of the first inverted layer 40. Accordingly, it is possible to produce an SiC vertical MOSFET of the Embodiment 2 excellent in the withstand voltage characteristic and the on-performance not having a trouble of dielectric breakdown of the gate oxide film to be caused by the high-concentration doping in the surface part of the first inverted layer 40.

Embodiment 3

Figure 6:
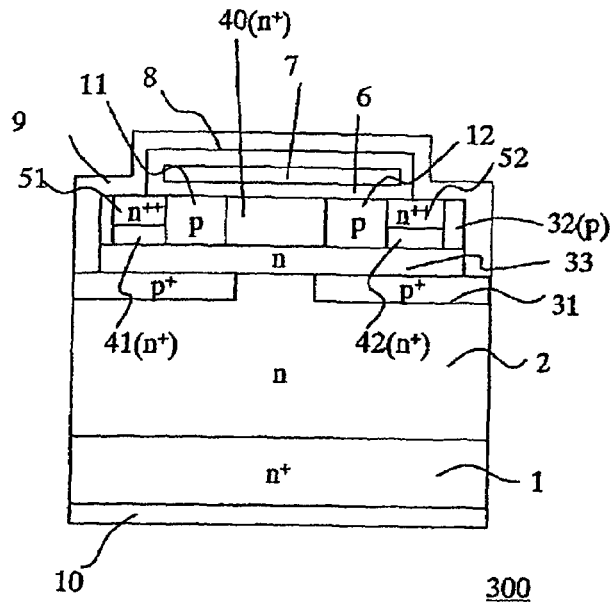
FIG. 6 is a cross-sectional view of a unit cell of an SiC vertical MOSFET of the third embodiment of the invention.
Figure 7:
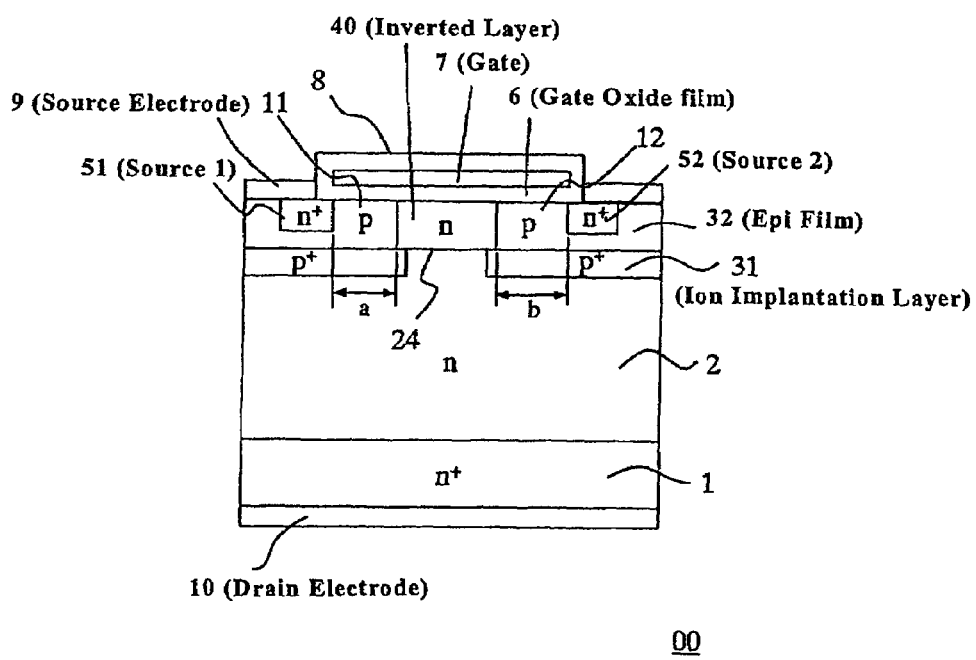
FIG. 7 is a cross-sectional view of a unit cell of a conventional SiC vertical MOSFET.

FIG. 6 is a cross-sectional view of an SiC vertical MOSFET of the third embodiment of the invention. Of the reference numerals indicating the constitutive members in the drawing, the same numerals as those in the above-mentioned FIG. 4 of the Embodiment 2 indicate the same members. This embodiment is the same as the Embodiment 2 in that the length of the channel regions 11 and 12 is the same and that the n-type source layers 51 and 52 are disposed at the same position as that of the second inverted layers 41 and 42. The difference is that a low-concentration n-type deposition layer 33 is disposed between the n-type drift layer 2 and the high-concentration p-type layer 31, and the low-concentration p-type deposition layer 32. The disposition of the low-concentration n-type layer makes it possible to prevent the dielectric breakdown of the gate oxide film in the OFF state and to further increase the withstand voltage of the configuration. The effect and the action of the low-concentration n-type deposition layer 33 to be disposed are described in detail in JP-A 2006-147789. Specifically, the low-concentration n-type deposition layer 33 is made to have a sufficient thickness, and as a result, the depletion layer that extends from the high-concentration p-type layer 31 reaches the gate oxide film 6 before the depletion layer is pinched off at its opening, therefore making it possible to prevent a strong electric field from being applied to the gate oxide film existing between the gate electrode 7 and the first inverted layer 40.

In the configuration of the unit cell of the SiC vertical MOSFET of the Embodiment 1 to the Embodiment 3 of the invention described in the above, the source electrode 9 spans the gate electrodes 7 via the interlayer insulating film 8 therebetween on the cell surface; however, the invention should not be limited to this and may have any other configuration where the source electrode is contacted with the surface-exposed part of the source layer 5, the p-type layer 32 and the p-type layer 31 in a mode of low-resistance interconnection. In the configuration of every embodiment, the gate oxide film 6 and the gate electrode 7 cover all the surface of the n-type base region 40 formed through reverse ion implantation from p-type to n-type; however, a part or all of the gate oxide film and the gate electrode in the region may be removed, or the thickness of the gate oxide film may be larger than that of the surface part of the channel regions 11 and 12. In all such configurations, the invention does not lose its effect and advantage. Furthermore, the invention is also applicable to MOSFET having a so-called buried channel configuration in which ions of n-type impurities are thinly implanted in the surface of the p-type layer 32 being the channel regions 11 and 12, thereby enhancing the channel conduction.

In the SiC vertical MOSFET of the above-mentioned embodiments of the invention, the crystal face orientation of the SiC crystal substrate 1 is not specifically defined. The invention is applicable to any of a {0001} face (referred to as silicon face) substrate or a {1120} face substrate or a {0001} face (referred to as carbon face) substrate generally widely employed in the art, and also to substrates having a surface parallel to the face with a minor off-angle of any of these faces; however, when the invention is applied to a {0001} face (carbon face) substrate or to a substrate having a surface parallel to the face thereof with a minor off-angle, then the dielectric breakdown strength near the voltage blocking junction may increase and the electron mobility in the channel region may also increase, and this is the most suitable for obtaining a high-voltage low on-resistance vertical MOSFET.

The invention claimed is:

1. A silicon carbide semiconductor device comprising:
a first deposition film (2) of a first-conductivity low-concentration silicon carbide formed on the surface of a first-conductivity high-concentration silicon carbide substrate (1),
a second deposition film (32) of a second-conductivity low-concentration silicon carbide formed on it,
a second-conductivity high-concentration gate region (31) formed selectively in the first deposition film so as to have a partial deficiency part (24) of the first-conductivity low-concentration silicon carbide remaining therein,
a first-conductivity first low-concentration inverted region (40) running through the second deposition film in the region where the partial deficiency part formed in the second deposition film is projected, second-conductivity low-concentration gate regions (11, 12) adjacent to the first low-concentration inverted region, first-conductivity second low-concentration inverted regions (41, 42) running through the second deposition film, first-conductivity high-concentration source regions (51, 52) at least a part of which is formed in the second low-concentration inverted region,
a gate insulation film (6) formed on the surface of the second deposition film,
a gate electrode (7) formed on at least the low-concentration region via the gate insulation film,
a drain electrode (10) connected to the back of the first-conductivity high-concentration silicon carbide substrate in a mode of low-resistance interconnection, and
a source electrode (9) connected to the first-conductivity high-concentration source region and to a part of the second-conductivity second deposition film in a mode of low-resistance interconnection.

2. The silicon carbide semiconductor device as claimed in claim 1, wherein the length of the second-conductivity low-concentration gate region (11) adjacent to one side of the first low-concentration inverted region (40) is the same as the length of the second-conductivity low-concentration gate region (12) adjacent to the other side thereof.

3. The silicon carbide semiconductor device as claimed in claim 1, wherein the length of the second-conductivity low-concentration gate regions (11, 12) is at most 2.0 p.m.

4. The silicon carbide semiconductor device as claimed in claim 1, wherein at least the edge of the first-conductivity high-concentration source regions (51, 52) on the side of the first inverted region (40) is formed inside the second reversed-implanted regions (41, 42).

5. The silicon carbide semiconductor device as claimed in claim 1, wherein the first-conductivity high-concentration source regions (51, 52) are formed inside the second reversed-implanted regions (41, 42).

6. A silicon carbide semiconductor device comprising:
a first deposition film (2) of a first-conductivity low-concentration silicon carbide formed on the surface of a first-conductivity high-concentration silicon carbide substrate (1),
a third deposition film (33) of a first-conductivity low-concentration silicon carbide formed on it,
a second deposition film (32) of a second-conductivity low-concentration silicon carbide formed on it,
a second-conductivity high-concentration gate region (31) formed selectively in the first deposition film so as to have a partial deficiency part (24) of the first-conductivity low-concentration silicon carbide remaining therein,
a first-conductivity first low-concentration inverted region (40) running through the third deposition film in the region where the partial deficiency part formed in the second deposition film is projected, second-conductivity low-concentration gate regions (11, 12) adjacent to the first low-concentration inverted region, first-conductivity second low-concentration inverted regions (41, 42) running through the second deposition film, first-conductivity high-concentration source regions (51, 52) at least a part of which is formed in the second low-concentration inverted region,
a gate insulation film (6) formed on the surface of the second deposition film,
a gate electrode (7) formed on at least the low-concentration region via the gate insulation film,
a drain electrode (10) connected to the back of the first-conductivity high-concentration silicon carbide substrate in a mode of low-resistance interconnection, and
a source electrode (9) connected to the first-conductivity high-concentration source region and to a part of the surface of the second-conductivity high-concentration gate region in a mode of low-resistance interconnection.

7. The silicon carbide semiconductor device as claimed in claim 6, wherein the length of the second-conductivity low-concentration gate region (11) adjacent to one side of the first low-concentration inverted region (40) is the same as the length of the second-conductivity low-concentration gate region (12) adjacent to the other side thereof.

8. The silicon carbide semiconductor device as claimed in claim 6, wherein the first-conductivity high-concentration source regions (51, 52) are formed in the second inverted regions (41, 42).

9. A method for producing a silicon carbide semiconductor device, comprising:
 a step (a) of forming a first deposition film (2) of a first-conductivity low-concentration silicon carbide on the surface of a first-conductivity high-concentration silicon carbide substrate (1),
 a step (b) of forming a second-conductivity high-concentration gate region (31) selectively on the first deposition film so as to have a partial deficiency part (24) of the first-conductivity low-concentration silicon carbide remaining therein,
 a step (c) of forming a second-conductivity second deposition film (32) on the second-conductivity high-concentration gate layer and on the first deposition film exposed in the partial deficiency part,
 a step (d) of forming a first inverted region (40) and second inverted regions (41, 42) each as reversed from second conductivity to first conductivity by selectively implanting a first-conductivity impurity ion into the depth to reach the high-concentration gate region from the region in which the partial deficiency part of the second-conductivity second deposition film is projected and from the surface of a region as spaced from that region to the right and left side by a predetermined length, and
 a step (e) of forming high-concentration source regions (51, 52) by selectively implanting a first-conductivity impurity ion to a high dose from the surface of the second inverted region of the second deposition film.

10. A method for producing a silicon carbide semiconductor device, comprising:
 a step of forming a first deposition film (2) of a first-conductivity low-concentration silicon carbide on the surface of a first-conductivity high-concentration silicon carbide substrate (1),
 a step of forming a second-conductivity high-concentration gate region (31) selectively on the first deposition film so as to have a partial deficiency part (24) of the first-conductivity low-concentration silicon carbide remaining therein,
 a step of forming a third deposition film (33) of a first-conductivity low-concentration silicon carbide on the second-conductivity high-concentration gate layer and on the first deposition film exposed in the partial deficiency part a step of forming a second deposition film of a second-conductivity low-concentration silicon carbide on the third deposition film,
 a step of forming a first inverted region (40) and second inverted regions (41, 42) each as reversed from second conductivity to first conductivity by selectively implanting a first-conductivity impurity ion into the depth to reach the high-concentration gate region from the region in which the partial deficiency part of the second-conductivity second deposition film is projected and from the surface of a region as spaced from that region to the right and left side by a predetermined length, and
 a step of forming high-concentration source regions (51, 52) by selectively implanting a first-conductivity impurity ion to a high dose from the surface of the second inverted region of the second deposition film.

11. The method for producing a silicon carbide semiconductor device as claimed in claim 9, wherein in the step of forming the first inverted region (40) and the second inverted regions (41, 42) through selective ion implantation of a first-conductivity impurity, the first and second inverted regions are formed through simultaneous implantation using the same implantation mask (140).

12. The method for producing a silicon carbide semiconductor device as claimed in claim 11, wherein in the step of forming the high-concentration source regions (51, 52) through selective high-concentration ion implantation of a first-conductivity impurity, the implantation mask (140) in the step of forming the second inverted region is used for the implantation.

13. The silicon carbide semiconductor device as claimed in claim 2, wherein the length of the second-conductivity low-concentration gate regions (11, 12) is at most 2.0 p.m.

14. The silicon carbide semiconductor device as claimed in claim 2, wherein at least the edge of the first-conductivity high-concentration source regions (51, 52) on the side of the first inverted region (40) is formed inside the second reversed-implanted regions (41, 42).

15. The silicon carbide semiconductor device as claimed in claim 2, wherein the first-conductivity high-concentration source regions (51, 52) are formed inside the second reversed-implanted regions (41, 42).

16. The silicon carbide semiconductor device as claimed in claim 7, wherein the first-conductivity high-concentration source regions (51, 52) are formed in the second inverted regions (41, 42).

17. The method for producing a silicon carbide semiconductor device as claimed in claim 10, wherein in the step of forming the first inverted region (40) and the second inverted regions (41, 42) through selective ion implantation of a first-conductivity impurity, the first and second inverted regions are formed through simultaneous implantation using the same implantation mask (140).

* * * * *